(12) United States Patent
Minn

(10) Patent No.: US 6,218,697 B1
(45) Date of Patent: *Apr. 17, 2001

(54) CONTACT IN SEMICONDUCTOR MEMORY DEVICE

(75) Inventor: Eun-Young Minn, Kyonggi-do (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,972

(22) Filed: Dec. 29, 1998

(30) Foreign Application Priority Data

Dec. 31, 1997 (KR) .................................. 97-80586

(51) Int. Cl.[7] ...................................... H01L 29/76
(52) U.S. Cl. .................. 257/306; 257/296; 257/310; 257/311; 257/312; 257/506; 257/532; 257/905; 257/906; 257/908
(58) Field of Search ...................... 257/306, 310, 257/311, 312, 296, 532, 506, 906, 908, 905

(56) References Cited

U.S. PATENT DOCUMENTS

| | | | | |
|---|---|---|---|---|
| 5,312,769 | * | 5/1994 | Matsuo et al. | 437/52 |
| 5,583,356 | * | 12/1996 | Yoon et al. | 257/296 |
| 5,689,126 | * | 11/1997 | Takaishi | 257/306 |
| 5,798,903 | * | 8/1998 | Dhote et al. | 257/310 |
| 5,828,096 | * | 10/1998 | Ohno et al. | 257/306 |

* cited by examiner

Primary Examiner—Eddie C. Lee
Assistant Examiner—Matthew E. Warren
(74) Attorney, Agent, or Firm—Jones Volentine, L.L.C.

(57) ABSTRACT

A contact in a semiconductor memory device is formed on an active region of a cell array region, rather than on a sloped area between the cell array region and a core region. Preferably, an insulating layer on the active region is etched to form a hole therein and the contact formed through the hole. Preferably, the etching is performed using an etch solution having a high etch selectivity between the insulating layer and a top layer of the active region. Thus, the contact is evenly formed and the area of the cell array region is reduced, thereby enabling cells to be packed on a chip with high density.

6 Claims, 6 Drawing Sheets

CONTACT IN SEMICONDUCTOR MEMORY DEVICE

BACKGROUND OF THE INVENTION

The present application claims priority under 35 U.S.C. §119 to Korean Application No. 80586 filed Dec. 31, 1997, the entire contents of which are hereby incorporated by reference.

1. Field of the Invention

The present invention is directed to a semiconductor memory device, and in particular, to a contact in a semiconductor memory device and a method of forming the same, such a contact preferably contributing to realization of packing cells in a chip at a high density.

2. Description of the Related Art

In order to electrically interconnect specific devices in semiconductor memory devices, especially, DRAMs (Dynamic Random Access Memories), metal contacts are formed over a silicon substrate, polysilicon layers for a word line and a bit line, and a plate electrode being the upper electrode of a capacitor, respectively. However, prior to formation of these metal contacts, steps are produced between a cell array region and a peripheral region, for example, a core region. These steps arise due to the difference between their deposition heights resulting from deposition of many material layers. In forming the contacts in a semiconductor memory device having such steps, insulating layers at different heights are etched to different depths. That is, a thin portion of an insulating layer is subjected to overetching and a thick portion thereof to underetching, so that it is highly likely to form an incomplete contact.

In particular, when $CF_4$ is used as an etching solution, as in related art, to form a contact for a plate electrode, its low etch selectivity gives rise to overetching of the plate electrode underlying an insulating layer, making the plate electrode thin, or leaves the insulating layer between the plate electrode and a metal electrode insufficiently etched, resulting in an electrical short. Thus, the use of $CF_4$ gives undesirable results.

Under these circumstances, a solution to overcome the above problems included extending a plate electrode across a cell array region to a peripheral region, for example, a core region. A metal contact is then formed over this extended plate electrode. A problem with this solution is that the slope between the cell array region having cells and the core region free of cells impedes even formation of the contact. Also, this solution requires that the cell array region be extended to the core region by an area needed for forming the contact therein, eventually decreasing the integration level of the entire semiconductor memory device.

SUMMARY OF THE INVENTION

The present invention is therefore directed to a contact in a semiconductor memory device and a method of forming the same, which substantially overcomes one or more of the problems due to the limitations and disadvantages of the related art.

It is an object of the present invention to provide a contact in a semiconductor memory device and a method of forming the same, which contribute to realization of high integration by reducing the area of a cell array region.

To achieve these and other objects, there is provided a semiconductor memory device having a cell array region divided into an active region and a field region, and a peripheral region. The semiconductor memory device includes an access transistor, a capacitor stacked with a storage electrode connected to the active region for the access transistor, a dielectric layer of a high dielectric constant, and a plate electrode in this order, and a plate electrode contact formed over the active region of the cell array region.

The semiconductor memory device may include an insulating layer formed on the capacitor and a contact hole in the insulating layer, the plate electrode contact being formed through the contact hole. The plate electrode contact may be formed over the storage electrode.

These and other objects of the present invention may also be realized by providing a semiconductor memory device including a first area including a memory cell, a second area free of a memory cell, adjacent to the first area, and a plate electrode contact formed in the first area.

The first area may be a cell array region and the second area is a core region. The semiconductor memory device may include an insulating layer formed on the first area and a contact hole in the insulating layer, the plate electrode contact being formed through the contact hole. The semiconductor memory device may include a storage electrode in the first area and wherein the plate electrode contact is formed over the storage electrode.

According to another aspect of the present invention, there is provided a method of forming a contact for a plate electrode in a semiconductor memory device. In the method for use in a semiconductor memory device having a capacitor stacked with a storage electrode, a dielectric layer of a high dielectric constant, and a plate electrode in this order, and an interlayer insulating layer formed on the plate electrode, a contact hole is formed into the interlayer insulating layer on the active region of a cell array region, the contact hole is filled with an electrode forming material, and the resultant structure is patterned.

The forming a contact hole may include positioning the contact hole over the storage electrode on the active region of the cell array region. The forming a contact hole may include etching the insulating layer using an etching solution having a high etch selectivity between the insulating layer and the plate electrode.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE PREFERRED EMBODIMENTS

Figure 1A:
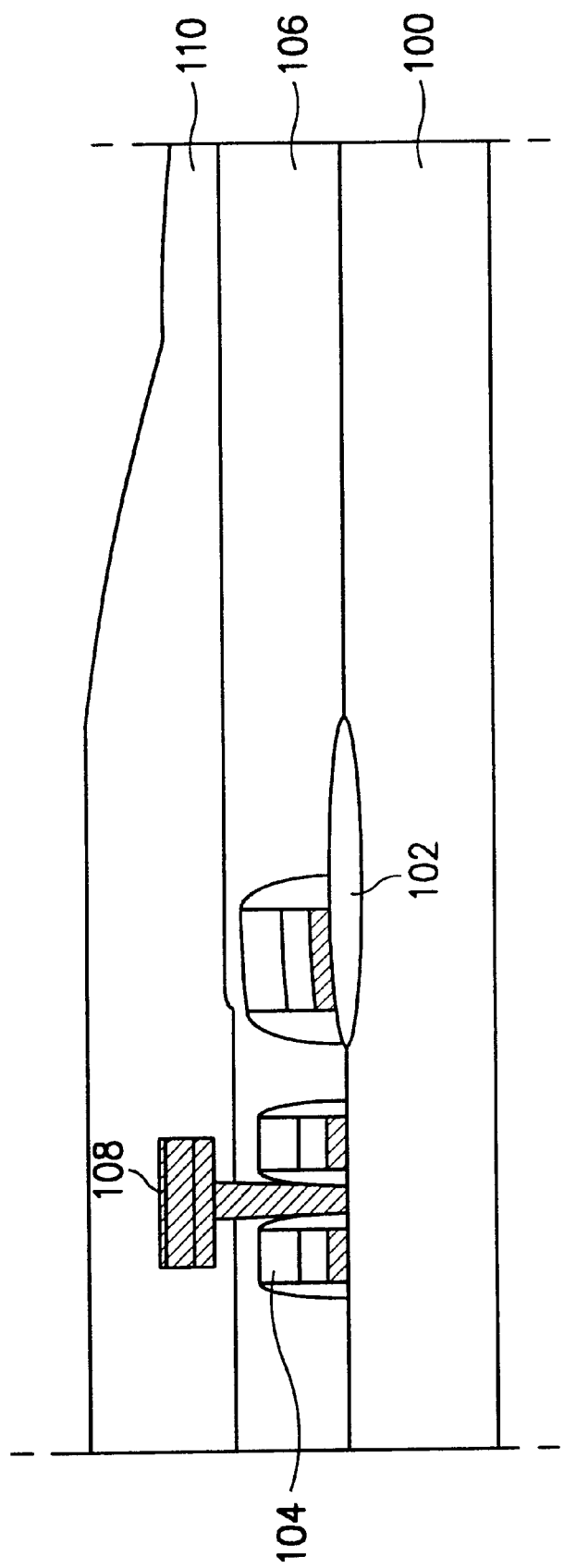
FIGS. 1A–1F are sectional views of a method of making a semiconductor memory device having a contact according to a preferred embodiment of the present invention, with FIG. 1F being the semiconductor memory device having a contact according to a preferred embodiment of the present invention.

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements. A description of the atmospheres and characteristics of a conventional fabricating process will be omitted when it is deemed to obscure the subject matter of the present invention.

Figure 1B:
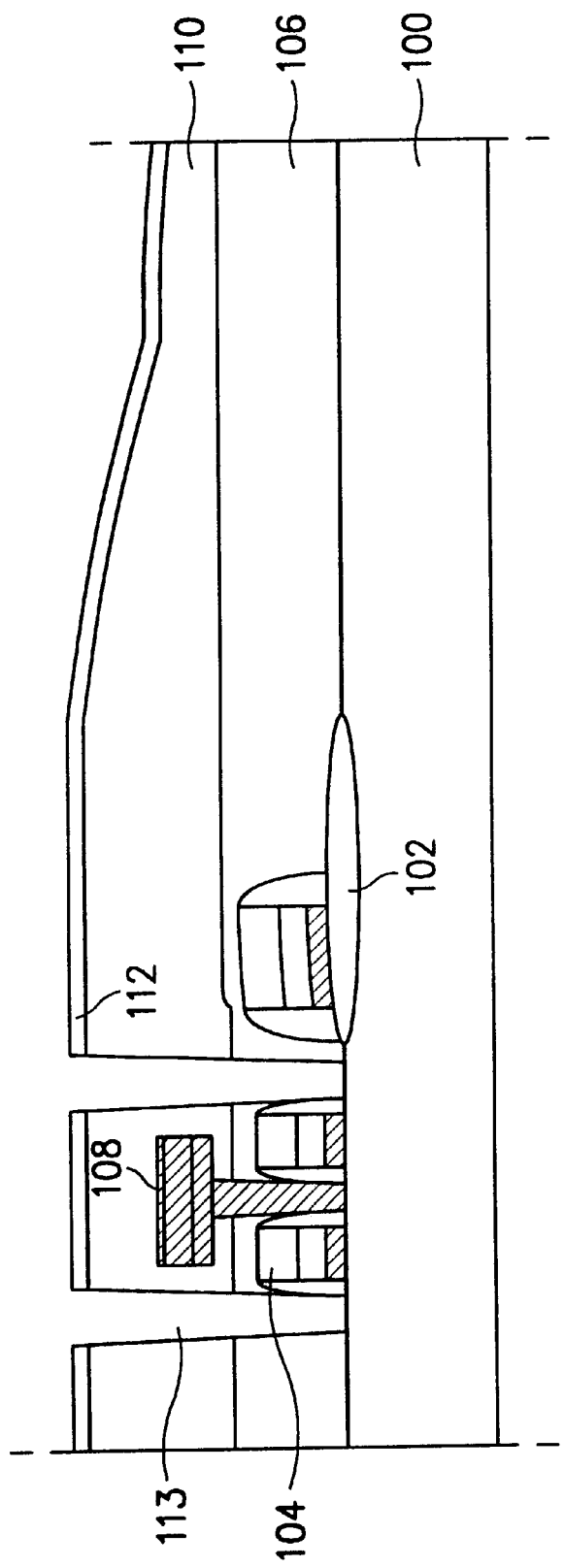
Figure 1C:
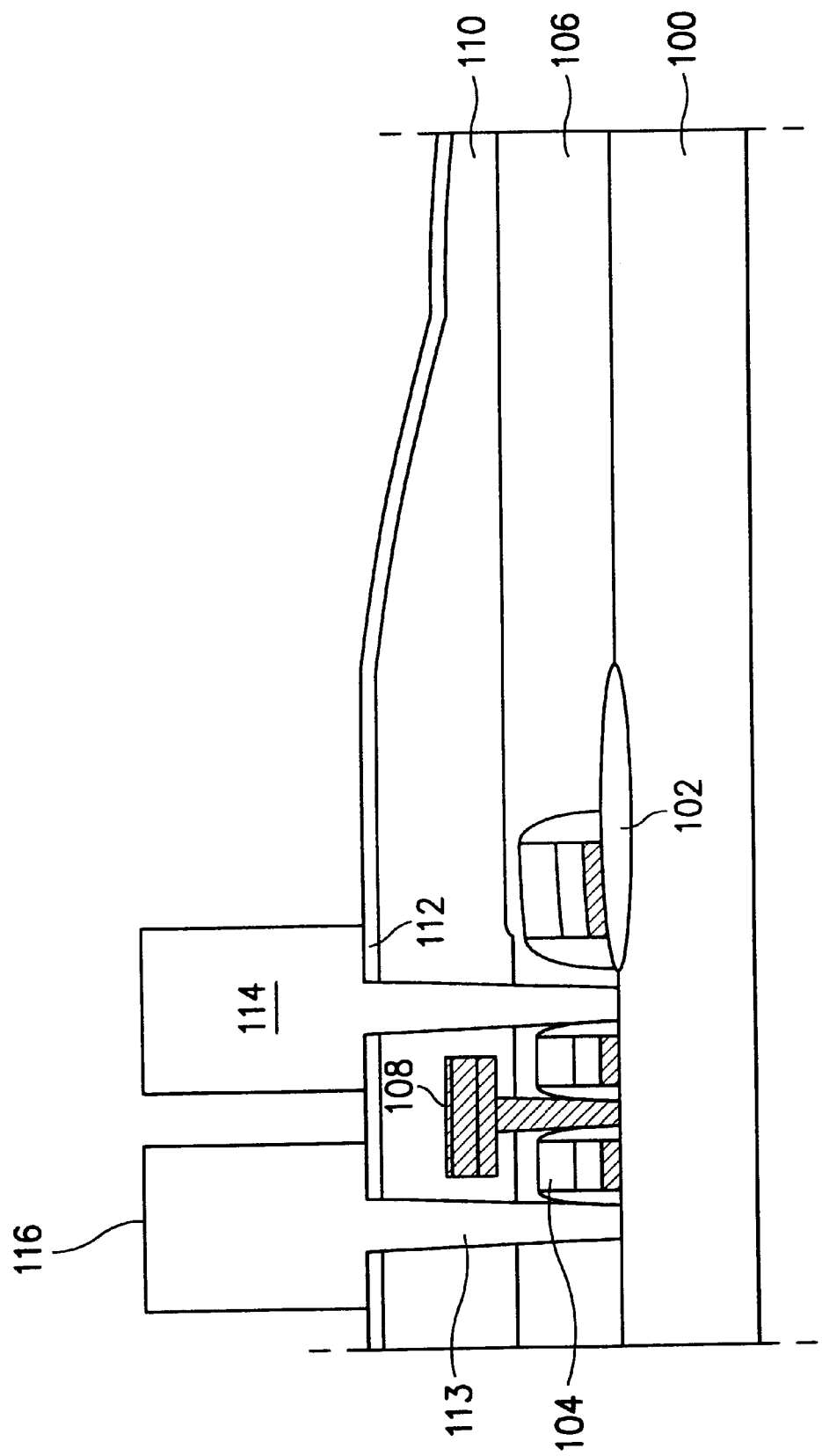
Figure 1D:
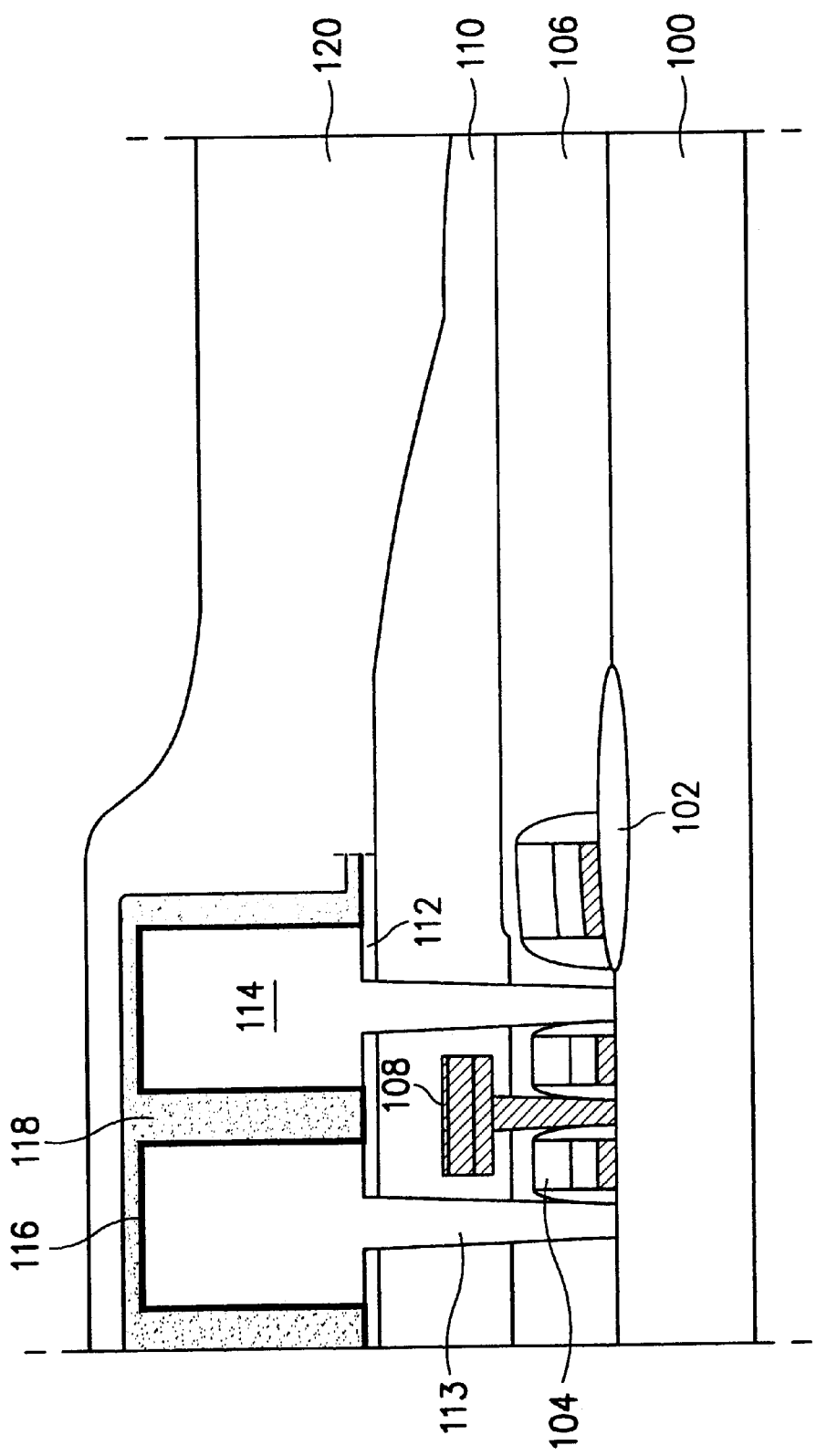
Figure 1E:
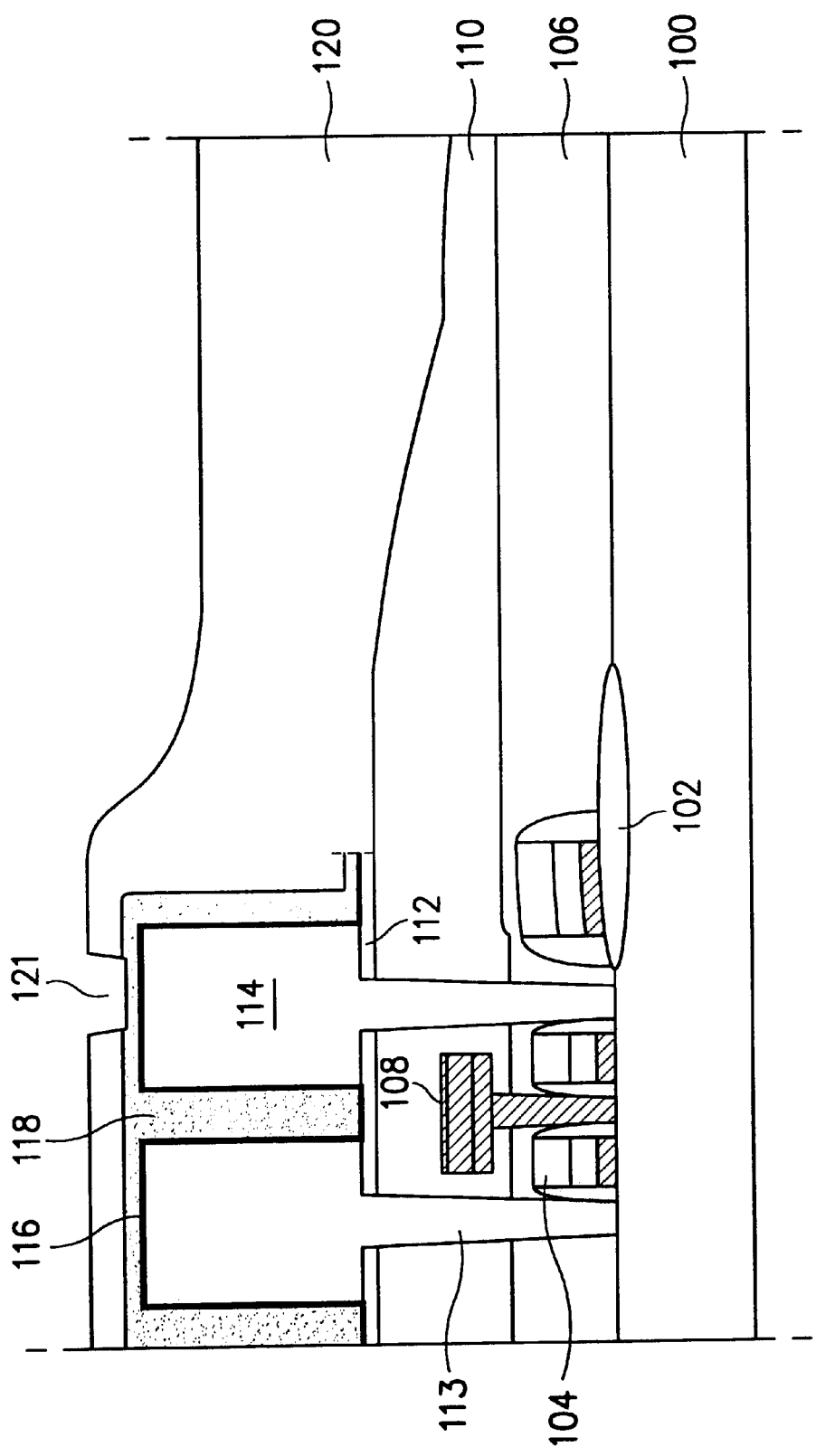
Figure 1F:
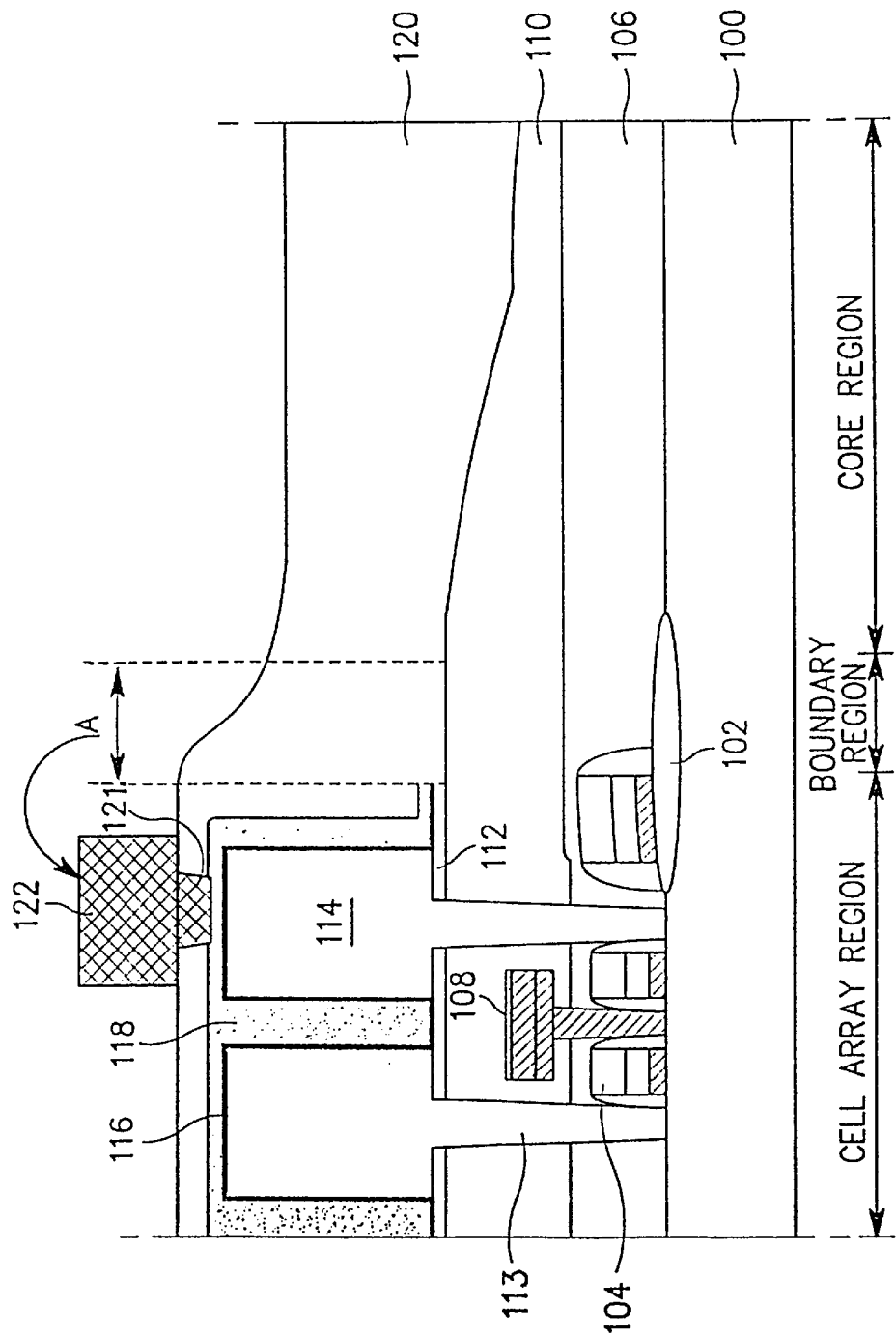

FIG. 1F illustrates a semiconductor memory device having a contact 122 formed on an active region in a cell array region according to the preferred embodiment of the present invention.

Referring to FIG. 1A, the semiconductor memory device includes a word line 104, a bit line 108 formed by a conventional process on a semiconductor substrate 100 having an active region defined by a field oxide film 102. First and second interlayer insulating layers 106 and 110 are formed around the word line 104 and the bit line 108.

As shown in FIG. 1B, an etch stop layer, for example, a nitride film 112 is formed on the second interlayer insulating layer 110. Then, to form a storage electrode acting as the lower electrode of a capacitor, an opening 113 is formed by sequentially etching portions of the nitride film 112, the second interlayer insulating layer 110, and the first interlayer insulating layer 106.

As shown in FIG. 1C, a storage electrode 114 is formed by depositing a first conductor on the nitride layer 112, filling the opening 113, and patterning the first conductor. Subsequently, an ONO (Oxide/Nitride/Oxide) film 116 having a high dielectric constant is formed on the storage electrode 114.

As shown in FIG. 1D, a plate electrode 118 is formed by depositing a conductive material on the ONO film 116 and patterning the conductive material, including etching the nitride layer 112 and the ONO film 116. As a result, the capacitor is completed. An insulating layer 120 is then formed over the capacitor.

As shown in FIG. 1E, after formation of the insulating layer 120, a hole 121 for receiving material for forming the contact 122 is formed over the plate electrode 118. Here, it is preferable to form the hole 121 with an etching solution having a high etch selectivity between a conductive layer and an insulating layer such as $CHF_4$ or CO in an etching equipment "DRM" of TEL Co. Also preferably, an energy, temperature, and an etching time are set to 1700 watt, about 60° C., and about 335 seconds in the etching equipment.

As shown in FIG. 1F, an electrode forming material, e.g., metal, is provided over the hole 121 and the resultant structure is patterned, thereby filling the hole 121 and forming the contact 122 for receiving an external power supply voltage. The method of forming the contact hole of the present invention enables the contact 122 for receiving an external power supply voltage to be formed over the storage electrode 114 in a cell array region without damaging the plate electrode 118.

By locating the contact 122 on the active region of the cell array region, rather than at the sloped boundary between the cell array region and the core region, the contact 122 can be formed evenly. Further, since there is no need for an area "A" shown in FIG. 1F, into which a plate electrode extends in the prior art, the area of the cell array region can be saved as much.

Thus, the semiconductor memory device in accordance with the present invention as shown in FIG. 1F includes a word line 104, a bit line 108, and a capacitor stacked with a storage electrode 114, a dielectric layer 116 having a high dielectric constant, and a plate electrode 118 in this order. An insulating layer 120 is provided over the capacitor. The contact 122 is formed in a hole through the insulating layer 120 on the plate electrode 118 which has been etched using an etching solution with a high etch selectivity between the insulating layer 120 and the plate electrode 118, and thus is located on the active region without harming the plate electrode.

While the present invention has been described with reference to the specific embodiment, it is to be clearly understood that many variations can be made by anyone skilled in the art within the scope and spirit of the present invention.

What is claimed is:

1. A dynamic random access memory (DRAM) having a cell array region including an active region, comprising:
   a plurality of access transistors;
   a plurality of capacitors, each capacitor stacked with a storage electrode connected to the active region for an access transistor, a dielectric layer of a high dielectric constant, and a plate electrode in that order, wherein the plate electrode is a common upper electrode for the capacitors; and
   a plate electrode contact formed directly over the at least one of the storage electrode and the access transistor, said plate electrode contact aligned to be only in the cell array region.

2. The dynamic random access memory of claim 1, further comprising an insulating layer formed on the capacitor and a contact hole in the insulating layer, the plate electrode contact being formed through the contact hole.

3. The dynamic random access memory of claim 1, wherein the plate electrode contact is formed over the storage electrode.

4. A dynamic random access memory (DRAM) comprising:
   a memory cell comprising
      a plurality of access transistors, and
      a plurality of capacitors, each capacitor stacked with a storage electrode connected to the active region for an access transistor, a dielectric layer of a high dielectric constant, and a plate electrode, in that order, wherein the plate electrode is a common upper electrode for the capacitors;
   a plate electrode contact formed directly over at least one of the storage electrode and the access transistor, said plate electrode contact aligned to be only in a cell array region of the DRAM;
   an insulating layer formed over at least one of the storage electrode and the access transistor; and
   a contact hole in the insulating layer, the plate electrode contact being formed through the contact hole.

5. The dynamic random access memory of claim 4, wherein the first area is a cell array region and the second area is a core region.

6. The dynamic random access memory of claim 4, further comprising a storage electrode in the first area and wherein the plate electrode contact is formed over the storage electrode.

* * * * *